United States Patent
Rius et al.

(10) Patent No.: US 7,975,646 B2
(45) Date of Patent: Jul. 12, 2011

(54) DEVICE FOR DEPOSITING A COATING ON AN INTERNAL SURFACE OF A CONTAINER

(75) Inventors: Jean-Michel Rius, Octeville-sur-Mer (FR); Nicolas Chomel, Octeville-sur-Mer (FR); Yves-Alban Duclos, Octeville-sur-Mer (FR)

(73) Assignee: Sidel Participations, Octeville-sur-Mer (FR)

( * ) Notice: Subject to any disclaimer, the term of this patent is extended or adjusted under 35 U.S.C. 154(b) by 974 days.

(21) Appl. No.: 11/822,942

(22) Filed: Jul. 11, 2007

(65) Prior Publication Data

US 2008/0011232 A1    Jan. 17, 2008

(30) Foreign Application Priority Data

Jul. 17, 2006  (FR) ..................... 06 06480

(51) Int. Cl.
| | |
|---|---|
| C23C 16/00 | (2006.01) |
| C23F 1/00 | (2006.01) |
| H01L 21/306 | (2006.01) |
| C03C 15/00 | (2006.01) |
| C03C 25/68 | (2006.01) |

(52) U.S. Cl. .. 118/723 MW; 156/345.41; 118/723 MA; 216/69; 216/70

(58) Field of Classification Search .......... 118/723 MW; 156/345.41
See application file for complete search history.

(56) References Cited

U.S. PATENT DOCUMENTS

| | | | |
|---|---|---|---|
| 7,582,845 B2 * | 9/2009 | Kobayashi et al. | 219/121.43 |
| 2002/0122897 A1 * | 9/2002 | Namiki et al. | 427/569 |
| 2004/0025791 A1 * | 2/2004 | Chen et al. | 118/728 |
| 2004/0149225 A1 * | 8/2004 | Weikart et al. | 118/723 MW |
| 2006/0019039 A1 * | 1/2006 | Hanawa et al. | 427/523 |

FOREIGN PATENT DOCUMENTS

| | | | |
|---|---|---|---|
| EP | 1561840 A1 | | 8/2005 |
| EP | 1619266 A1 | | 1/2006 |
| EP | 1630250 A1 | | 3/2006 |
| JP | 07-321096 | * | 12/1995 |
| JP | 2002-339074 | * | 11/2002 |
| WO | 02/09891 A1 | | 2/2002 |
| WO | 2004/044039 A2 | | 5/2004 |
| WO | WO 2004/081254 | * | 9/2004 |
| WO | 2006/000539 A1 | | 1/2006 |
| WO | 2006/000561 A2 | | 1/2006 |
| WO | 2006/005837 A2 | | 1/2006 |

* cited by examiner

*Primary Examiner* — Parviz Hassanzadeh
*Assistant Examiner* — Rakesh Dhingra
(74) *Attorney, Agent, or Firm* — Sughrue Mion, PLLC

(57) ABSTRACT

Device for depositing a coating on an internal surface of a container, of the type in which the deposition is carried out by means of a low-pressure plasma created inside the container by excitation of a precursor gas by microwave-type electromagnetic waves. An injection tube is provided that dips into the container to a length of between one quarter and one half of the total height of the container in question, between the top and the bottom of the container said length of the injection tube constituting a longitudinal antenna capable of picking up a UHF electromagnetic wave generated by said generator and of propagating the HT ignition signal, a UHF short-circuit in the form of a plate being provided on the injection tube in such a way that the face of said plate on the cavity side defines a point of zero amplitude of the electromagnetic wave propagating along said injection tube, the length between said short-circuit and the free end of said injection tube corresponding to an odd number of quarter-wavelengths so as to obtain a maximum amplitude, that is to say an antinode, at the free end of the injection tube.

18 Claims, 3 Drawing Sheets

DEVICE FOR DEPOSITING A COATING ON AN INTERNAL SURFACE OF A CONTAINER

TECHNICAL FIELD

The present invention relates to a device for depositing a coating on an internal surface of a container made of a thermoplastic, of the type in which the deposition is carried out by means of a low-pressure plasma, which is created inside the container by excitation of a precursor gas by electromagnetic waves of microwave type, and of the type in which the container is placed in an enclosure made of conducting material into which the microwaves are introduced, said device comprising: a) an electromagnetic wave generator; b) an electromagnetic waveguide for connecting the generator to a window in the side wall of the enclosure, allowing at least one central field to be generated in this enclosure; c) means for injecting the precursor gas; d) means for pumping down the enclosure and the internal volume of the container; and e) an internal envelope, coaxial with the enclosure and substantially transparent to the electromagnetic waves, for example made of quartz, and defining a cylindrical cavity in which the container is placed during excitation of the precursor gas.

BACKGROUND OF THE INVENTION

FIG. 1 illustrates schematically a device designed in accordance with the provisions of document FR 2 792 854 for treating containers one by one, which device is in the form of a treatment station 1 suitable for low-pressure plasma deposition of a coating on the internal surface of a container made of a thermoplastic, such as preferably, but not exclusively, a bottle made of polyethylene terephthalate (PET), which coating to be formed may consist of hydrocarbon-based or silica-based material.

Briefly, the station 1 comprises an outer cavity 2 made of conducting material, especially a metal. The cavity 2 is cylindrical with an axis A and has dimensions so as to promote a particular coupling mode of a microwave-type electromagnetic field. A generator 3, which is placed outside the cavity 2, is capable of delivering an electromagnetic field in the microwave range, the frequency of which may be typically 2.45 GHz or 915 MHz, the generator 3 being of the UHF (Ultra-High Frequency) electromagnetic wave generator type. The electromagnetic radiation delivered by the generator 3 is brought into the cavity 2 by a radially extending tunnel-shaped waveguide 4 which emerges, via a rectangular window 5 made in the cavity 2, at approximately mid-height of said cavity. The shape and the dimensions of the waveguide 4 are themselves also adapted so as to allow favorable coupling of the microwave field in the cavity 2.

Placed inside the cavity 2 is an envelope 6, which is coaxial with a cavity 2 and substantially transparent to the microwaves, which envelope defines, inside the cavity 2, a cylindrical enclosure 7 coaxial with the cavity 2. In practice, the envelope 6 is for example made of quartz. The enclosure 7 is closed off at the bottom by a bottom transverse wall of the cavity 2 and at the top by a lid 9 intended to form a sealed closure in such a way that a vacuum can be created in the enclosure 7. The container 10 to be treated is placed so as to be substantially coaxial with the cavity 2 and with the enclosure 7.

In the embodiment in question, the lid 9 is removable so as to allow the introduction of the container 10 to be treated into the enclosure 7. However, it would also be possible to provide a fixed lid and a removable bottom made in the bottom transverse wall of the cavity 2 in order to introduce or remove the container from below. Provided on the lid 9 are means 11 for supporting the container 10 by its neck 12, means for creating various levels of vacuum in the enclosure 7, and means for injecting, into the container 10, a reactive fluid that contains at least one precursor of the material that it is desired to deposit on the internal wall of the container, said injection means comprising an injection tube 13 extending partly into the container.

The device also includes respective upper and lower annular plates 14, 15 of axis A, which are placed in the cavity 2 around the envelope 6. The two plates 14, 15 are offset axially one with respect to the other so as to be placed axially on either side of the window 5 via which the waveguide 4 emerges in the cavity 2. However, their respective axial positions may vary according to the shape of the container 10 to be treated. The plates 14, 15, which are made of an electrically conducting material, are intended to form short-circuits for the electromagnetic field formed in the cavity 2 so that the field is confined axially in order to obtain a maximum intensity in the effective treatment zone.

However, the plasma coating process in a device as described above, although operating correctly, suffers from certain risks that may result in nonuniform deposition of the coating.

This is because it is often difficult to precisely control the ignition of the plasma and its stability, an unstable plasma incurring risks of forming a nonuniform coating on the internal wall of the container.

At the present time, to check whether a plasma is stable or not, the luminous intensity in the container is measured using a luminosity sensor. If a luminous instability is detected, it is therefore considered that the plasma was unstable and therefore, arbitrarily, that the coating was not deposited correctly. The container is then rejected from the production line.

Thus, if the deposition of the coating takes place by means of an installation for internally coating several thousand containers per hour, it is necessary to reduce as far as possible the percentage of containers that are not correctly coated, which represent scrap and possibly amounting to several hundred containers per day. Presently, the percentage of containers scrapped, since potentially they are not correctly coated, is around 0.5%. It would be particularly advantageous to lower this percentage so as to reduce the scrap generated by such an installation and, consequently, to reduce the corresponding loss of raw material.

Moreover, when the electromagnetic waves are transmitted into the cavity, they are reflected by the injection tube and tend to rise up along the latter toward the center of the treatment device, incurring risks of malfunction of the device and loss of electromagnetic energy that can be used in the treatment cavity, hence risks of plasma instability.

The present invention therefore relates to a device for coating an internal wall of a container, allowing both optimum distribution of the precursor gases in the container, in order to form a uniform coating, and prevention of the electromagnetic wave from rising up along the injection tube.

Thus, the present invention relates to a device for depositing a coating on an internal wall of a container making it possible to initiate and facilitate the formation of the plasma during transmission of the microwaves, and also to prevent the loss of electromagnetic energy that can be used in the treatment cavity, resulting in the formation of a more stable plasma and in the creation of a production line for internally coating containers with a percentage of containers scrapped that is substantially lower than 0.5% and advantageously tending toward a zero percentage of scrapped containers.

SUMMARY OF THE INVENTION

To achieve this, the subject of the present invention is a device for depositing a coating on an internal surface of a container made of a thermoplastic, of the type in which the deposition is carried out by means of a low-pressure plasma, which is created inside the container by excitation of a precursor gas by electromagnetic waves of UHF microwave type, and of the type in which the container is placed in a cavity made of conducting material into which the microwaves are introduced, said device comprising: a UHF electromagnetic wave generator; an electromagnetic waveguide for connecting the generator to a window in the side wall of the cavity, allowing at least one central field to be generated in the cavity; means for injecting the precursor gas, comprising an injection tube extending partly into the container; means for pumping down the cavity and the internal volume of the container; and an internal envelope, coaxial with the cavity and substantially transparent to the electromagnetic waves, for example made of quartz, and defining a cylindrical chamber in which the container is placed during excitation of the precursor gas, distinguished by the fact that the injection tube dips into the container by a length of between one quarter and one half of the total height of the container considered between the top and the bottom of the container, the length of the injection tube constituting a longitudinal antenna capable of picking up the UHF electromagnetic wave generated by said generator, wherein a microwave short-circuit in the form of a plate is provided on the injection tube in such a way that the face of said plate on the side facing the cavity defines a point of zero amplitude of the electromagnetic wave that propagates along the injection tube, the length between the short-circuit and the free end of the injection tube corresponding to an odd number of quarter-wavelengths so as to obtain a maximum amplitude, that is to say an antinode of the electromagnetic wave, at the free end of the injection tube.

In this way, because the end of the injection tube corresponds to an antinode of the electromagnetic wave propagated along this tube, and because of the placement of this end between one half and one quarter of the total height of the container, ignition of a stable plasma is facilitated since the end of the injector corresponds to a point of maximum electromagnetic intensity for a given wavelength and with a uniform distribution of the gases in the container.

The short circuit, in order for the electromagnetic wave to be of zero amplitude and to at least partly arrest its propagation along the injection tube, is a circular radial plate through the center of which the injection tube passes. The surface current along the injection tube is therefore zero on that surface of the circular plate on the side directed toward the cavity.

To improve the blocking effect, whereby the propagation of the electromagnetic wave along the injection tube is blocked, an annular skirt, coaxial with the injection tube and directed toward the cavity, bears on the circular radial plate.

Advantageously, according to a first embodiment of the short-circuit, the annular skirt bears on the external rim of the circular plate.

In order for the injection tube to be electrically isolated from the rest of the device, the circular plate and the injection tube must not touch the rest of the enclosure and may be embedded in a dielectric plug through which the injection tube passes axially.

Advantageously, according to a second embodiment of a short-circuit, the circular plate has a central orifice of greater diameter than the diameter of the injection tube, and the annular skirt bears on the internal rim of the plate.

To prevent the propagation of the electromagnetic field rising up along the injector downstream of the circular plate, the height of the internal face of the annular skirt is approximately equal to one quarter of the wavelength of the wave emitted by the generator and circulating in the dielectric medium in which the circular plate and the skirt lie. Moreover, the free end of the annular skirt therefore corresponds to an antinode of the wave, therefore corresponding to a maximum voltage and a minimum current, hence reduced Joule heating losses. Thus, uncontrolled heating of the free end of the annular skirt is prevented owing to the minimal Joule heating losses at this end.

To control the electromagnetic field along the injection tube, the short circuit is provided in an annular space between a cylindrical element, called a sleeve, and the injection tube.

In order to pump down the internal volume of the container, the end of the cylindrical element bears in a sealed manner on the top of the container.

To stabilize the plasma during generation of the electromagnetic field and during deposition of the coating on the internal wall of the container and, thus, to reduce the risks of a coating being nonuniformly deposited on the internal wall of the container, the device according to the invention comprises high-voltage signal generator means that are coupled to the injection tube and capable of sending a high-voltage sinusoidal signal to the injection tube.

According to a preferred embodiment for maximizing the stability of the plasma generated in the container, the high-voltage sinusoidal signal has a voltage between 500 and 3,000 V.

Advantageously, the high-voltage sinusoidal signal consists of a plurality of signals of damped sinusoidal signals.

Advantageously, the carrier frequency of said signal is between 1 and 50 kHz.

According to one advantageous embodiment, the envelope frequency of said signal is between 100 and 10,000 Hz.

Advantageously, said envelope frequency is between 500 and 2,000 Hz.

Advantageously, the peak value of the high-voltage signal at the end of one of said cycles is damped to between 0 and 60% of the peak value of the first peak of this cycle.

Advantageously, the peak value of the high-voltage signal at the end of one of said cycles is damped to between 20 and 40% of the peak value of the first peak of this cycle.

To improve the blocking of the electromagnetic wave propagation along the injection tube, the diameter of the circular plate is at least more than twice the diameter of the injection tube.

To reduce the amount of electromagnetic energy that is not blocked by the circular plate of the short-circuit provided according to the invention, a second circular plate is fixed radially to the injection tube upstream of the circular plate.

Advantageously, the distance between the circular plate and said second circular plate corresponds to a multiple of the half-wavelength of the electromagnetic wave generated by said generator.

BRIEF DESCRIPTION OF THE DRAWINGS

The invention will be more clearly understood upon reading the following detailed description of certain preferred embodiments, given solely by way of nonlimiting examples. This description refers to the appended drawings in which.

DESCRIPTION OF THE PREFERRED EMBODIMENT OF THE INVENTION

Figure 1:
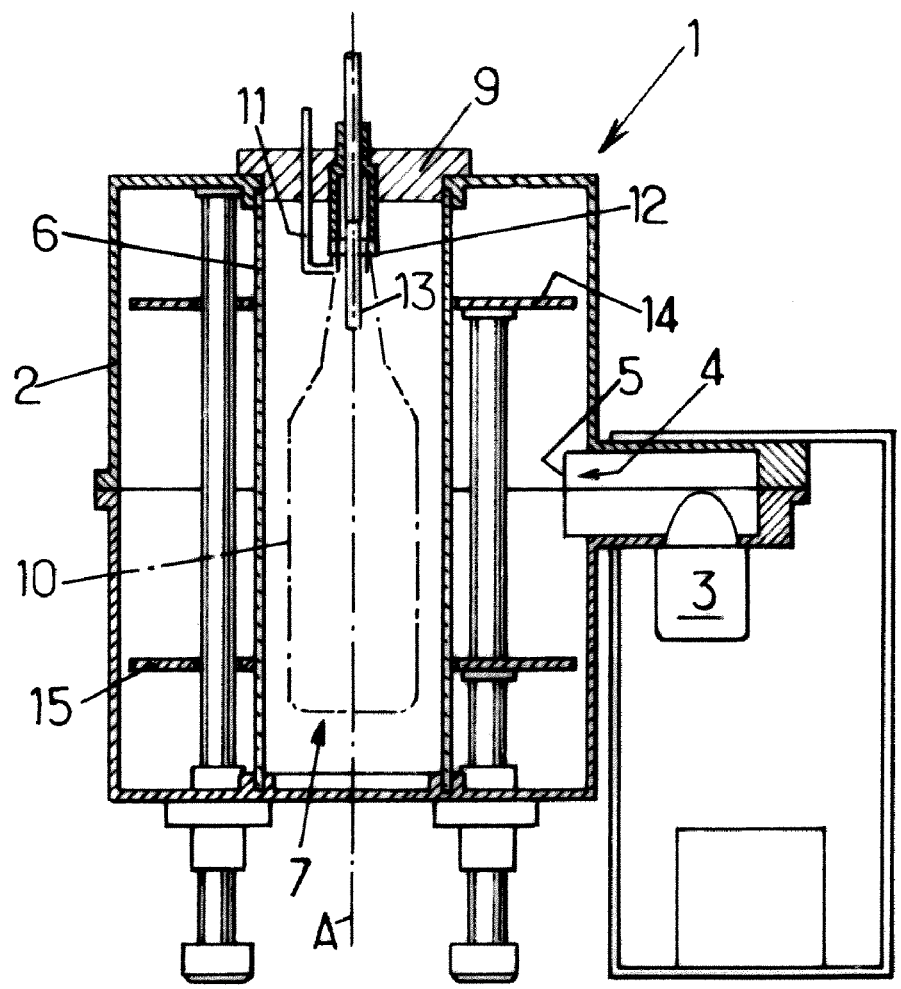
FIG. 1 is a schematic side view, in cross section, of a device according to the prior art for treating containers one by one.

As already described, FIG. 1 is a schematic view of a device for depositing a coating on an internal surface of a thermoplastic container 10, of the type in which the deposition is carried out by means of a low-pressure plasma created inside the container by excitation of a precursor gas by microwave-type UHF electromagnetic waves, and of the type in which the container 10 is placed in a cavity 2 made of conducting material into which the microwaves are introduced, said device comprising: a UHF electromagnetic wave generator 3; an electromagnetic waveguide 4, for connecting said generator 3 to a window 5 in the side wall of the cavity 2; means for injecting the precursor gas; means for pumping down the cavity 2 and the internal volume of the container 10; and an internal envelope 6, coaxial with the cavity 2 and with at least one central field generated in the cavity 2, said envelope being substantially transparent to the electromagnetic waves, for example made of quartz, and defining a cylindrical enclosure 7 in which the container 10 is placed during excitation of the precursor gas.

Figure 2:
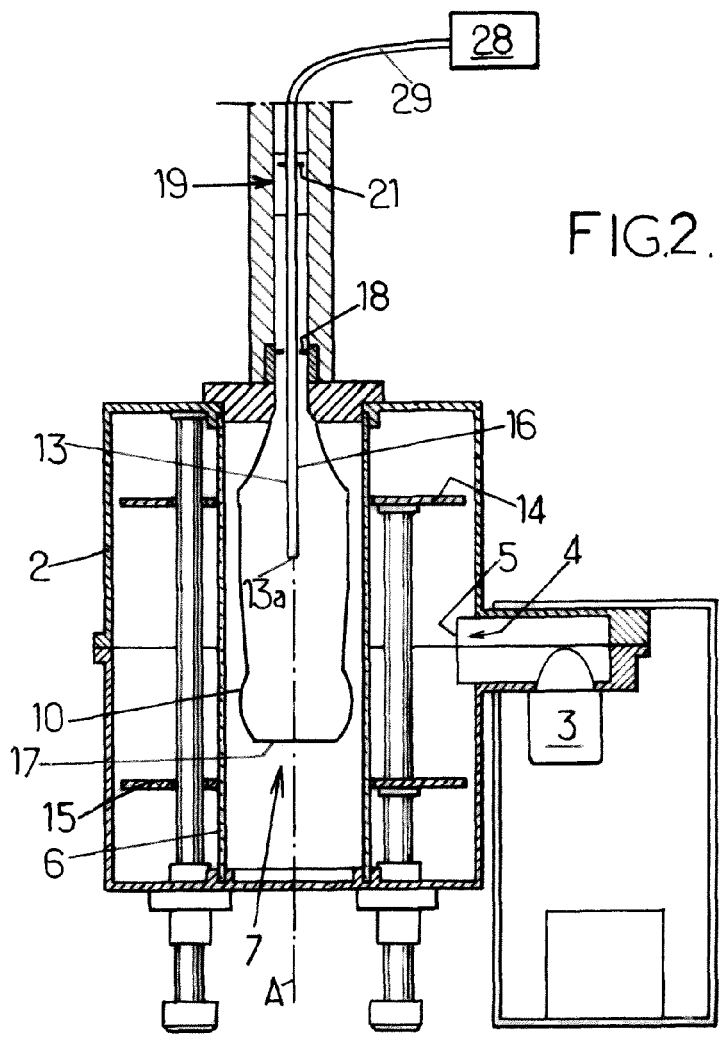
FIG. 2 is a schematic side view of a device for treating containers one by one according to the invention.

FIG. 2 is a schematic sectional view of one embodiment of a device 1 for treating containers 10 one by one in order to deposit a coating on the internal surface of the container 10.

According to this embodiment, the means for injecting the precursor gas into the internal volume of the container 10 take the form of an injection tube 13, constituting a longitudinal antenna 16 capable of picking up a UHF electromagnetic wave generated by the generator 3, placed substantially along the central axis A defined by the container 10, the cavity 2 and the envelope 6. The second function of this antenna 16 is to propagate the high-voltage signal transmitted by the high-voltage signal generator means 28, as will be explained later.

In the rest of the description, the notion of the injection tube 13 also denotes the notion of the antenna 16, these two elements being identical.

Advantageously, the container 10 takes the form of a bottle with a neck 12, a bottom 17 and a top 18, the principle of the invention applying to any type of container with a bottom and a top, that is to say a closed end and an open end.

To allow good flow of the injected gases into the internal volume of the container 10 and to ensure that the gases are distributed uniformly within this internal volume, the free end 13a of the injection tube 13 is dipped into the container 10 to a length of between one quarter and one half of the total height of the container 10, namely with a length of between one quarter and one half of the distance between the top 18 and the bottom 17 of the container 10. Thus, owing to the better distribution of the gases injected into the internal volume of the container 10, a more stable plasma is obtained during electromagnetic excitation.

A UHF short-circuit 19 is provided, advantageously in electrical conduction contact on the injection tube 13 in a part of the latter that remains outside the container 10, so as to short-circuit the propagation of the electromagnetic wave along the injection tube 13.

Figure 3:
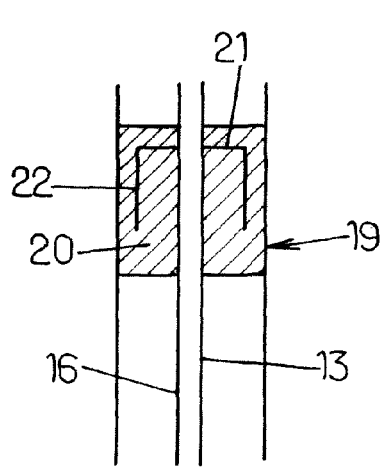
FIG. 3 is a schematic sectional view of a short-circuit provided on the injector of the device according to the invention.

According to one embodiment, as illustrated in FIG. 3, the short-circuit 19 takes the form of a plug 20, preferably made of a dielectric, for example polyetheretherketone, through which the injection tube 13 passes axially and embedded in which is a plate 21, which is advantageously circular, radial, conducting and preferably metallic, the injection tube 13 passing through its center, the diameter of the circular plate 21 being less than the diameter of the plug 20.

Alternatively, the short-circuit 19 is composed only of the circular plate 21.

In both cases, the electromagnetic wave propagating along the injection tube 13 has a zero amplitude on that side of the circular plate 21 directed toward the cavity 2.

An annular skirt 22, coaxial with the tube 13, bears on the circular plate 21 and is directed toward the cavity 2.

According to one embodiment, the annular skirt 22 bears on the external rim of the circular plate 21.

Figure 4:
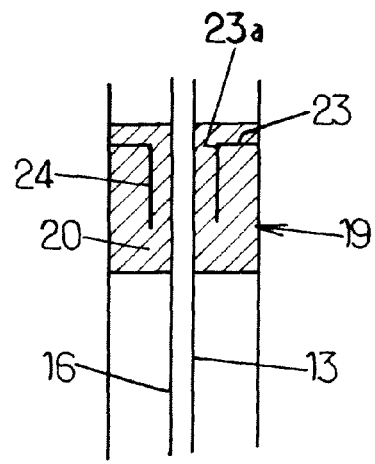
FIG. 4 is an alternative embodiment of a short-circuit provided on the injector according to the invention.

According to another embodiment of the short-circuit 19 as illustrated in FIG. 4, a dielectric plug 20 is provided, the injection tube 13 passing through the center of said plug, with a radial circular plate 23 embedded in the plug 20, the circular plate 23 having a central orifice 23a of larger diameter than the diameter of the injection tube 13, an annular skirt 24 then bearing on the internal rim of the circular plate 23, and the annular skirt 24 being directed toward the cavity 2 and coaxial with the injection tube 13. The circular plate 23 then has its external peripheral rim coincident with the cylindrical outer perimeter of the plug 20.

Advantageously, the height of the internal face of the annular skirt 22, 24 is approximately equal to one quarter of the wavelength of the electromagnetic wave transmitted by the generator 3, which is propagated along the antenna 16, this wavelength being dependent on the dielectric material in which the circular plate 21, 23 and the annular skirt 22, 24 lie.

In other words, in order to prevent the electromagnetic wave rising downstream of the circular plate 21, 23, the height of the internal face of the annular skirt 22, 24 is approximately equal to one quarter of the wavelength of the wave transmitted by the generator and circulating in the medium in which the circular plate 21, 23 and the skirt 22, 24 lie. In addition, the free end of the annular skirt 22, 24 then corresponds to an antinode of the electromagnetic wave, thereby corresponding to a maximum voltage and a minimum current, hence reduced Joule heating losses. Thus, uncontrolled overheating of the free end of the annular skirt 22, 24 is prevented, because of the minimal Joule heating losses at this end.

Thus, if the circular plate 21, 23 is embedded in a dielectric plug 20, the height of the annular skirt is equal to one quarter of the wavelength of the electromagnetic wave circulating in such a dielectric medium.

Alternatively, if the circular plate 21 is not embedded in a dielectric plug 20 but is only fixed radially to the antenna 16 in the vacuum, then the height of the internal face of the annular skirt 22 is equal to one quarter of the wavelength of the electromagnetic wave circulating in the vacuum.

More generally, the height of the internal face of the annular skirt is equal to one quarter of the wavelength of the electromagnetic wave circulating in the medium in which the circular plate and the skirt are inserted, for example a vacuum or a dielectric. The short circuit then forms a quarter-wave trap.

Figure 5:
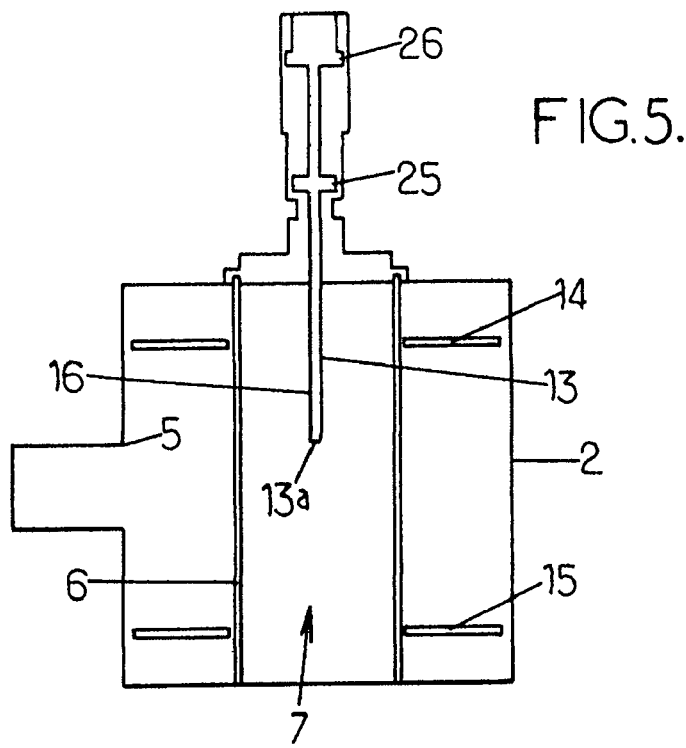
FIG. 5 is a schematic front sectional view of an alternative embodiment of the device according to the invention.

To limit the rise of the electromagnetic waves along the antenna 16, it is also possible, according to a third embodiment of the invention illustrated in figure 5, to fix a pair of circular plates 25, 26 along the injection tube 13.

This is because, when only a single circular plate is present, the electromagnetic energy is not completely blocked and short-circuited along the injection tube 13 and it is preferable to add a second circular plate 26 above the first plate 25 so as to block practically all the electromagnetic energy rising along the injection tube 13. Thus, a downstream first plate 25 located above the top 18 of the container 10, according to the conditions described above, and an upstream second plate 26 placed above the downstream plate 25 are provided.

Preferably, the distance between the downstream plate 25 and the upstream second plate 26 corresponds to a multiple of half-wavelengths of the electromagnetic wave transmitted by the electromagnetic wave generator 3.

Advantageously, in all the embodiments described, the diameter of the circular plate 21, 23, 25, 26 is at least greater than twice the diameter of the injection tube 13 and preferably at least four times greater than the diameter of the injection tube 13.

The addition of an annular skirt 22, 24 on the circular plate 21, 23 makes it possible to increase the amount of electromagnetic energy prevented from rising along the injection tube 13.

Figure 6:
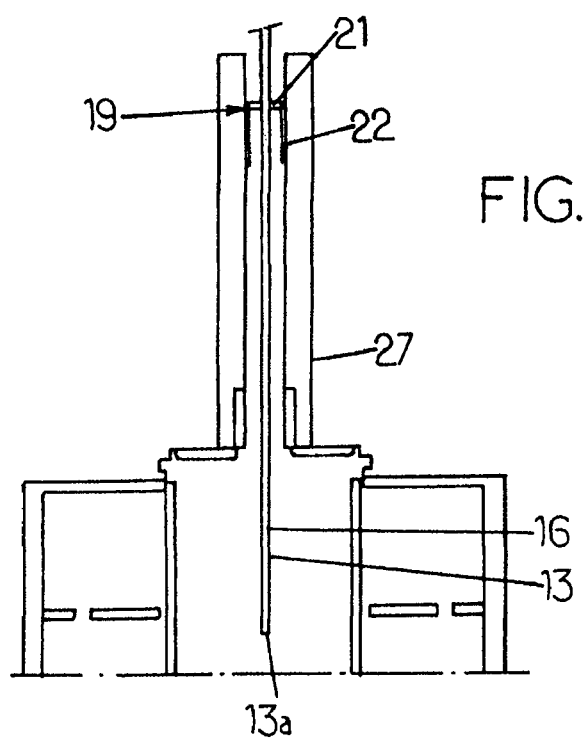
FIG. 6 is a schematic sectional view of another embodiment of the device according to the invention.

Thus, as shown in FIG. 6, the presence of just one circular plate 21 with an annular skirt 22, as described above in relation to FIG. 3, makes it possible to prevent practically all the electromagnetic energy from rising along the antenna 16.

Advantageously, the injection tube 13 passing through a sleeve 27, the end of which is used to form a sealed connection with the top 18 of the container 10, the diameter of the circular plate 21 or of the annular skirt 22 being very close to but slightly smaller than the diameter of the internal orifice of the sleeve 27.

To control the electromagnetic wave along the injection tube 13, the short-circuit 19 is provided in an annular space between a cylindrical element belonging to the lid 9, said element being called a sleeve 27, and the injection tube 13.

The short-circuit 19, and more particularly that face of the circular plate 21, 23, 25 facing the cavity, defines a point of zero amplitude of the electromagnetic wave propagating along the tube 13. The length between the short-circuit 19 and the end 13a corresponds to an odd number of quarter-wavelengths so as to obtain a maximum amplitude, that is to say an antinode, at the free end 13a of the injection tube 13.

Additionally, a high-voltage sinusoidal signal is sent to the injection tube 13 using high-voltage signal generator means 28, of type known per se, and coupled via a high-voltage cable 29 to the injection tube 13 upstream of the short-circuit 19 or of the upstream second circular plate 26.

Preferably, the frequency of the high-voltage signal is between 1 and 50 kHz and preferably close to 7,200 kHz. In the case of a damped high-voltage signal, this is then the carrier frequency.

The signal is sent all the time or part of the time, or conditionally (for example only if a certain luminosity threshold is detected in the internal envelope 6) during the plasma production cycle, that is to say during the electromagnetic discharge phase and the phase during which the coating is deposited on the internal wall of the container 10.

Advantageously, the high-voltage signal is damped and therefore consists of the generation of a plurality of cycles of parameterizable damped sinusoidal signals, the envelope frequency of which, that is to say the frequency of the damped sinusoidal cycles, is between 100 and 10,000 Hz, preferably between 500 and 6,000 Hz and even more preferably between 500 and 2,000 Hz and even more preferably still 1,000 Hz.

The high-voltage sinusoidal signal has a voltage between 500 and 3,000 V, preferably 1,000 V.

Preferably, the peak value of the high-voltage signal at the end of one of said cycles is damped to between 0 and 60% of the peak value of the first peak of this same cycle, preferably to between 20 and 40% of the peak value of the first peak of this cycle and even more preferably to 30% at most.

Advantageously, the frequency ratio between the carrier frequency and the envelope frequency, must be greater than 2 and even more preferably must be greater than 7.

Surprisingly, it has been discovered that generating and/or maintaining such a high-voltage sinusoidal signal improves the stability of the plasma in a production line and therefore reduces the number of luminous instabilities detected by the luminosity sensor and therefore reduces the number of containers that are scrapped because they potentially have a non-uniform coating.

In order for the injection tube 13 to be electrically isolated from the rest of the device, the circular plate 21, 23, 25 and the injection tube 13 must not touch the rest of the enclosure—they may be embedded in a dielectric plug through which the injection tube 13 passes axially. In this way, the injection tube 13 is electrically isolated so as to avoid any electric arc or leakage current somewhere on the injection tube 13 with the exception of the free end 13a of the injection tube 13 or another point predetermined during the design stage, by a specific design on the injection tube 13, for example by adding a radial tip on the free end 13a of the injection tube 13. This is because it is desirable to obtain a maximum concentration of electrons at a given point in order thereby to facilitate ignition of the plasma and therefore to avoid any leakage currents, hence the need for electrically isolating the injection tube 13 and possibly for adding a radial tip on the free end of the injection tube.

The invention claimed is:

1. A device for depositing a coating on an internal surface of a container made of a thermoplastic, of the type in which the deposition is carried out by means of a low-pressure plasma, which is created inside the container by excitation of a precursor gas by electromagnetic waves of UHF microwave type, and of the type in which the container is placed in a cavity made of conducting material into which the microwaves are introduced, said device comprising:

a UHF electromagnetic wave generator;

an electromagnetic waveguide for connecting said generator to a window in the side wall of the cavity, allowing at least one central field to be generated in said cavity;

means for injecting the precursor gas, comprising an injection tube extending partly into the container;

means for pumping down the cavity and the internal volume of the container; and an internal envelope, coaxial with the cavity and substantially transparent to the electromagnetic waves, for example made of quartz, and defining a chamber in which the container is placed during excitation of the precursor gas;

wherein the injection tube dips into the container by a length of between one quarter and one half of the total height of the container considered between the top and the bottom of the container, said length of the injection tube constituting a longitudinal antenna capable of picking up the UHF electromagnetic wave generated by said generator, wherein a UHF short-circuit in the form of a plate is provided on the injection tube in such a way that the face of said plate on the side facing the cavity defines a point of zero amplitude of the electromagnetic wave that propagates along said injection tube, the length between said short-circuit and the free end of said injection tube corresponding to an odd number of quarter-wavelengths so as to obtain a maximum amplitude, that is to say an antinode, at the free end of the injection tube;

wherein the short-circuit is a circular radial plate through the center of which the injection tube passes, said circular plate embedded in a dielectric plug through which the injection tube passes axially.

2. The device as claimed in claim 1, wherein an annular skirt, coaxial with the injection tube and directed toward the cavity, bears on the circular radial plate.

3. The device as claimed in claim 2, wherein the annular skirt bears on the external rim of said plate.

4. The device as claimed in claim 1, wherein said circular plate has a central orifice of larger diameter than the diameter of the injection tube and wherein said annular skirt bears on the internal rim of said plate.

5. The device as claimed in claim 1, wherein the height of the internal face of the annular skirt is approximately equal to one quarter of the wavelength of the wave emitted by the generator and circulating in the dielectric plug in which said circular plate and the skirt lie.

6. The device as claimed in claim 1, wherein the short circuit is provided in an annular space between a cylindrical element and the injection tube.

7. The device as claimed in claim 6, wherein the end of the cylindrical element bears in a sealed manner on the top of the container.

8. The device as claimed in claim 1, which includes high-voltage signal generator means that are coupled to the injection tube and are capable of sending a high-voltage sinusoidal signal to the injection tube.

9. The device as claimed in claim 8, wherein the high-voltage sinusoidal signal has a voltage between 500 and 3,000 V.

10. The device as claimed in claim 8, wherein said high-voltage sinusoidal signal consists of a plurality of cycles of damped sinusoidal signals.

11. The device as claimed in claim 10, wherein the envelope frequency of said signal is between 100 and 10,000 Hz.

12. The device as claimed in claim 11, wherein said envelope frequency is between 500 and 2,000 Hz.

13. The device as claimed in claim 10, wherein the peak value of the high-voltage signal at the end of said cycles is damped to between 0 and 60% of the peak value of the first peak of this cycle.

14. The device as claimed in claim 13, wherein the peak value of the high-voltage signal at the end of one of said cycles is damped to between 20 and 40% of the peak value of the first peak of this cycle.

15. The device as claimed in claim 8, wherein the carrier frequency of said signal is between 1 and 50 kHz.

16. The device as claimed in claim 1, wherein the diameter of the circular plate is at least more than twice the diameter of the injection tube.

17. The device as claimed in claim 1, wherein a second circular plate is fixed radially to the injection tube upstream of the circular plate.

18. The device as claimed in claim 17, wherein the distance between the circular plate and said second circular plate corresponds to a multiple of the half-wavelength of the electromagnetic wave generated by said generator.

* * * * *